(12) United States Patent
Lin et al.

(10) Patent No.: US 10,726,890 B2
(45) Date of Patent: Jul. 28, 2020

(54) RESISTIVE MEMORY APPARATUS AND OPERATING METHOD THEREOF

(71) Applicant: Winbond Electronics Corp., Taichung (TW)

(72) Inventors: Lih-Wei Lin, Taichung (TW); Yu-Cheng Chuang, Taichung (TW); Sung-Yi Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/177,460

(22) Filed: Nov. 1, 2018

(65) Prior Publication Data

US 2019/0172535 A1 Jun. 6, 2019

(30) Foreign Application Priority Data

Dec. 5, 2017 (CN) .......................... 2017 1 1264932

(51) Int. Cl.
*G11C 13/00* (2006.01)
*G11C 11/00* (2006.01)

(52) U.S. Cl.
CPC ............ *G11C 11/00* (2013.01); *G11C 13/003* (2013.01); *G11C 13/004* (2013.01); *G11C 13/0023* (2013.01); *G11C 13/0026* (2013.01); *G11C 13/0033* (2013.01); *G11C 13/0038* (2013.01); *G11C 13/0069* (2013.01); *G11C 13/0097* (2013.01); *G11C 2013/0073* (2013.01); *G11C 2013/0083* (2013.01); *G11C 2213/79* (2013.01); *G11C 2213/82* (2013.01)

(58) Field of Classification Search
CPC ............ G11C 13/0069; G11C 13/0097; G11C 13/004; G11C 13/0038; G11C 13/0033; G11C 13/003; G11C 13/0026; G11C 13/0023; G11C 2213/82; G11C 2213/79; G11C 2013/0083; G11C 2013/0073

See application file for complete search history.

(56) References Cited

U.S. PATENT DOCUMENTS

| 8,279,654 B2* | 10/2012 | Otsuka | G11C 13/0009 365/100 |
|---|---|---|---|
| 8,750,043 B2 | 6/2014 | Su et al. | |
| 9,058,872 B2 | 6/2015 | Yu et al. | |
| 2007/0008786 A1* | 1/2007 | Scheuerlein | G11C 13/0011 365/189.15 |
| 2016/0133836 A1* | 5/2016 | Lan | H01L 45/16 365/51 |
| 2016/0240250 A1 | 8/2016 | Oh et al. | |

FOREIGN PATENT DOCUMENTS

| CN | 103854693 | 6/2014 |
|---|---|---|
| CN | 105097020 | 11/2015 |

* cited by examiner

*Primary Examiner* — Ajay Ojha
(74) *Attorney, Agent, or Firm* — JCIPRNET

(57) ABSTRACT

A resistive memory apparatus including a memory cell array and a voltage selector circuit is provided. The memory cell array includes a plurality of memory cells. The voltage selector circuit is coupled to the memory cell array. The voltage selector circuit performs a voltage applying operation on the memory cells via a plurality of different signal transmission paths. Each of the signal transmission paths passes one of the memory cells. IR drops of two of the signal transmission paths are substantially identical, and signal transmission directions thereof are different. In addition, an operating method of a resistive memory apparatus is also provided.

13 Claims, 8 Drawing Sheets

RESISTIVE MEMORY APPARATUS AND OPERATING METHOD THEREOF

CROSS-REFERENCE TO RELATED APPLICATION

This application claims the priority benefit of China application serial no. 201711264932.7, filed on Dec. 5, 2017. The entirety of the above-mentioned patent application is hereby incorporated by reference herein and made a part of this specification.

BACKGROUND OF THE INVENTION

1. Field of the Invention

The invention relates to a memory apparatus and an operating method thereof, and more particularly, to a resistive memory apparatus and an operating method thereof.

2. Description of Related Art

In recent years, the resistive memory (e.g., resistive random access memory (RRAM)) has been rapidly developed to become one of most watched future memory structures. With advantages like low power consumption, high speed operation, high density and potential of being compatible with the manufacturing process of complementary metal-oxide-semiconductor, the resistive memory is very suitable for serving as the next generation non-volatile memory device.

The conventional resistive memory usually includes a top electrode and a bottom electrode disposed opposite to each other, and a dielectric layer located between the top electrode and the bottom electrode. Before the conventional resistive memory can repeatedly switch between high and low resistance states for memorizing data, a forming procedure for a current path needs be completed. The forming procedure includes applying a bias (e.g., a positive bias) to the resistive memory so current flows from the top electrode to the bottom electrode and oxygen vacancy and oxygen ions can be generated in the dielectric layer to form the current path (also called as a filament), such that the resistive memory is changed from high resistance state (HRS) to low resistance state (LRS). Normally, in the formed filament, a diameter of a portion near the top electrode is smaller than a diameter of a portion near the bottom electrode. Afterwards, processes of resetting or setting the resistive memory may be performed so the resistive memory can switch between HRS and LRS to store data. In addition, during the process of resetting the conventional resistive memory, a reverse bias with opposite polarity to a bias in the process of setting is applied to the resistive memory such that current flows from the bottom electrode to the top electrode. At this time, oxygen vacancy is combined with some of oxygen ions at the portion near the top electrode to interrupt the current path such that the filament is cut off at the portion near the top electrode. During the processing of setting the conventional resistive memory, the bias with identical polarity to the bias for forming the filament is applied to the resistive memory such that current flows from the top electrode to the bottom electrode. At this time, oxygen ions at the portion near the top electrode are released such that the filament is re-formed at the portion near the top electrode.

However, in the conventional art, when the forming procedure and/or an initial reset operation are performed on memory cells, the memory cells at different locations may have different distances with respect to the voltage source. The distances can derive a parasitic IR drop effect. After the forming procedure and/or the initial reset operation are completed, the memory cells at the different locations will show different characteristics due to the IR drop effect, resulting in uneven quality of the memory cell array overall, thereby reducing reliability for reading and writing the memory cells.

SUMMARY OF THE INVENTION

The invention is directed to a resistive memory apparatus and an operating method thereof. Such operating method can be automatically performed and can improve reliability for reading or wiring memory cells.

The resistive memory apparatus of the invention includes a memory cell array and a voltage selector circuit. The memory cell array includes a plurality of memory cells. The voltage selector circuit is coupled to the memory cell array. The voltage selector circuit performs a voltage applying operation on the memory cells via a plurality of different signal transmission paths. Each of the signal transmission paths passes one of the memory cells. IR drops of two of the signal transmission paths are substantially identical, and signal transmission directions thereof are different.

The operating method of the resistive memory apparatus of the invention includes multiple steps. The resistive memory apparatus includes M memory cells. A first step is to perform a voltage applying operation on an Nth memory cell of the M memory cells via a first signal transmission path, wherein the first signal transmission path passes the Nth memory cell, and N<M where M and N are positive integers; a second step is to perform the voltage applying operation on a Kth memory cell of the M memory cells via a second signal transmission path, wherein the second signal transmission path passes the Kth memory cell, and K≤M where K is a positive integer; and a third step is to repeatedly perform the first step and the second step until the voltage applying operation is completed for all of the M memory cells. M, N and K satisfy a relational expression of N+K=M+1. An IR drop of the first signal transmission path is substantially identical to an IR drop of the second signal transmission path, and a signal transmission direction of the first signal transmission path is different from a signal transmission direction of the second signal transmission path.

To make the above features and advantages of the disclosure more comprehensible, several embodiments accompanied with drawings are described in detail as follows.

DESCRIPTION OF THE EMBODIMENTS

Figure 1:
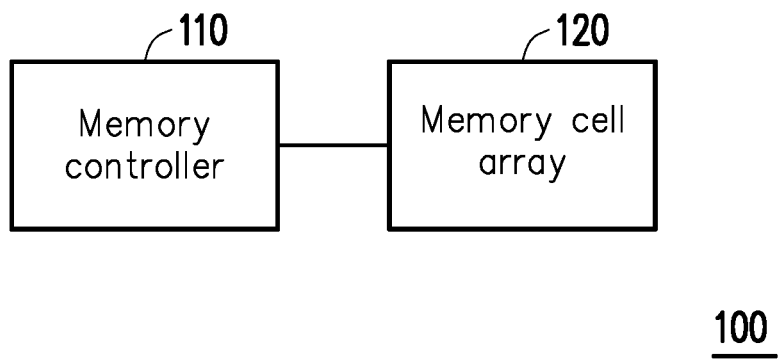
FIG. 1 illustrates a schematic diagram of a resistive memory apparatus in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments are provided below to describe the invention in detail, though the invention is not limited to the provided embodiments, and the provided embodiments can be suitably combined. The term "couple" used throughout the specification (including claims) may refer to any direct or indirect electrical connection means. Further, there is no sequential relationship between each of ordinal numbers in the specification or the claims, such as "first", "second", "third", etc.

Figure 2:
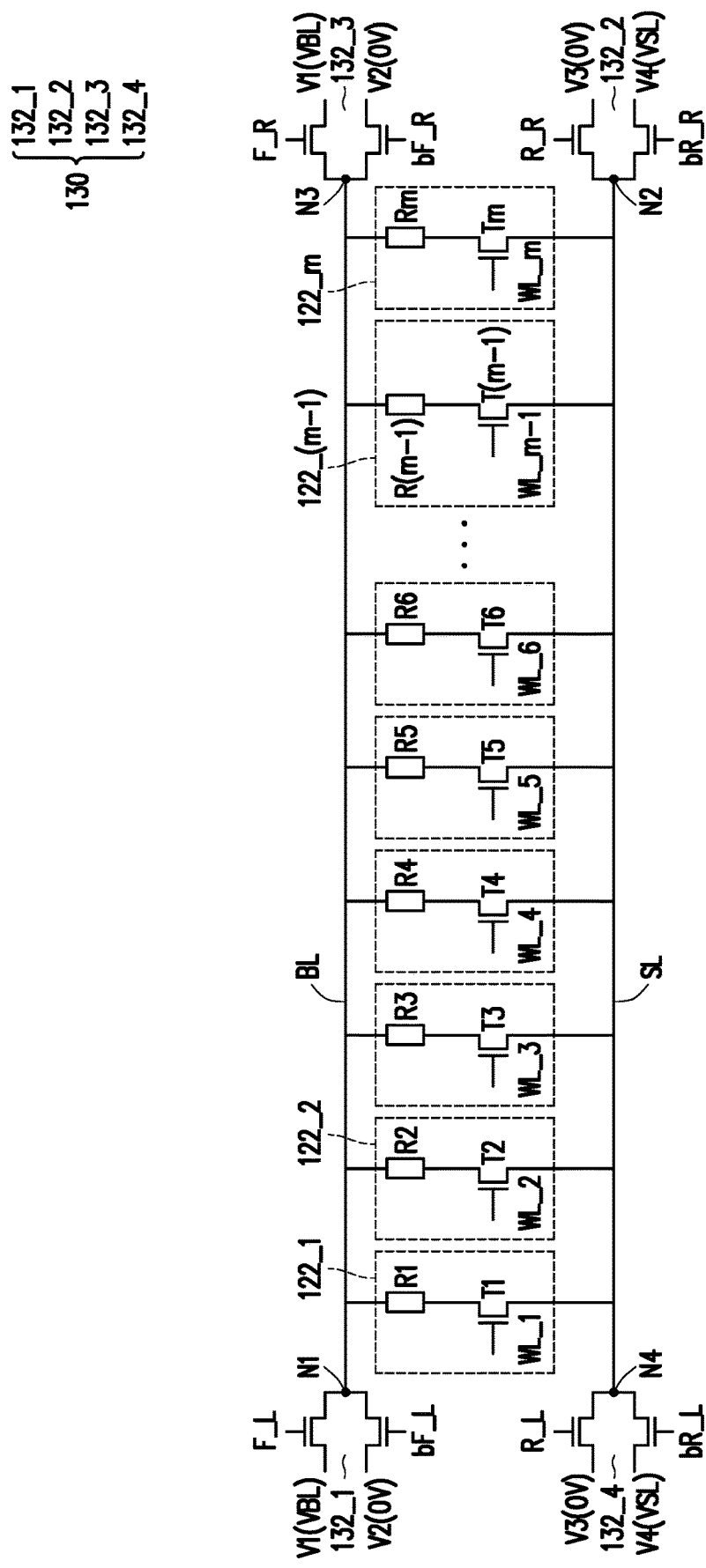
FIG. 2 illustrates a schematic diagram of a memory cell array and a voltage selector circuit in the embodiment of FIG. 1.

FIG. 1 illustrates a schematic diagram of a resistive memory apparatus in an embodiment of the invention. FIG. 2 illustrates a schematic diagram of a memory cell array and a voltage selector circuit in the embodiment of FIG. 1. With reference to FIG. 1 and FIG. 2, a resistive memory apparatus 100 of the present embodiment includes a memory controller 110 and a memory cell array 120. In the present embodiment, the memory controller 110 is configured to control overall operations of the memory cell array 120 including procedures or operations such as a forming procedure, an initial reset operation, a reset operation, a set operation, a write operation and a read operation, etc., and enough teaching, suggestion, and implementation illustration regarding a control method of the above may be obtained with reference to common knowledge in the related art.

In the present embodiment, the memory cell array 120 includes a source line SL, a bit line BL, a plurality of word lines WL_1 to WL_m and a plurality of memory cells 122_1 to 122_m. In the present embodiment, the memory cell array 120 includes M memory cells, where M is a positive integer. Each of the memory cells includes a variable resistance element and a switch element. For example, the memory cell 122_1 includes a variable resistance element R1 and a switch element T1, the memory cell 122_m includes a variable resistance element Rm and a switch element Tm, and structures of the remaining memory cells may be derived likewise.

In the present embodiment, the memory cell array 120 includes a first terminal N1, a second terminal N2, a third terminal N3 and a fourth terminal N4. The voltage selector circuit 130 is configured to couple the first terminal N1, the second terminal N2, the third terminal N3 and the fourth terminal N4 to predetermined voltages, so as to perform a voltage applying operation on the memory cells 122_1 to 122_m. The voltage selector circuit 130 may be disposed on the memory cell array 120 or other circuit blocks in the resistive memory apparatus 100, and a disposing location of the voltage selector circuit 130 is not particularly limited in the invention. In the present embodiment, a first terminal of the switch element of each of the memory cells 122_1 to 122_m is coupled to the first terminal N1 and the third terminal N3 via the bit line BL. A second terminal of the switch element of each of the memory cells 122_1 to 122_m is coupled to the second terminal N2 and the fourth terminal N4 via the source line SL. Further, a control terminal of the switch element of each of the memory cells 122_1 to 122_m is coupled to corresponding one of the word lines WL_1 to WL_m.

Specifically, in the present embodiment, the voltage selector circuit 130 includes a first voltage selector 132_1, a second voltage selector 132_2, a third voltage selector 132_3 and a fourth voltage selector 132_4. In the present embodiment, the first voltage selector 132_1 couples the first terminal N1 of the memory cell array 120 to a first voltage V1 or a second voltage V2 according to control signals F_L and bF_L. The second voltage selector 132_2 couples the second terminal N2 of the memory cell array 120 to a third voltage V3 or a fourth voltage V4 according to control signals R_R and bR_R. The third voltage selector 132_3 couples the third terminal N3 of the memory cell array 120 to the first voltage V1 or the second voltage V2 according to control signals F_R and bF_R. The fourth voltage selector 132_4 couples the fourth terminal N4 of the memory cell array 120 to the third voltage V3 or the fourth voltage V4 according to control signals R_L and bR_L. In this way, when the voltage applying operation is performed, the first voltage V1, the second voltage V2, the third voltage V3 and the fourth voltage V4 may be selected and applied to the corresponding memory cells.

In the present embodiment, the control signals F_L, bF_L, R_R, bR_R, F_R, bF_R, R_L and bR_L may be outputted by an additionally disposed Y-multiplexer (abbr. Y-MUX, which is not illustrated) and configured to control output voltages of the first voltage selector 132_1, the second voltage selector 132_2, the third voltage selector 132_3 and the fourth voltage selector 132_4. In the embodiment of the invention, the first voltage V1 is, for example, a bit line voltage VBL, the second voltage V2 and the third voltage V3 are, for example, a ground voltage (0 V), and the fourth voltage V4 is, for example, a source line voltage VSL. Implementation of the voltage selector circuit 130 and voltage values of the first voltage V1, the second voltage V2, the third voltage V3 and the fourth voltage V4 are not particularly limited in the invention.

In the present embodiment, the voltage selector circuit 130 performs the voltage applying operation on the memory cells 122_1 to 122_m via a plurality of different signal transmission paths. Each of the signal transmission paths includes one memory cell of the memory cells 122_1 to 122_m. FIG. 3A to FIG. 3D illustrate schematic diagrams of a voltage applying operation performed on the memory cells by the voltage selector circuit in the embodiment of FIG. 2. FIG. 4 illustrates a flowchart of an operating method of a resistive memory apparatus in an embodiment of the invention.

Figure 3A:
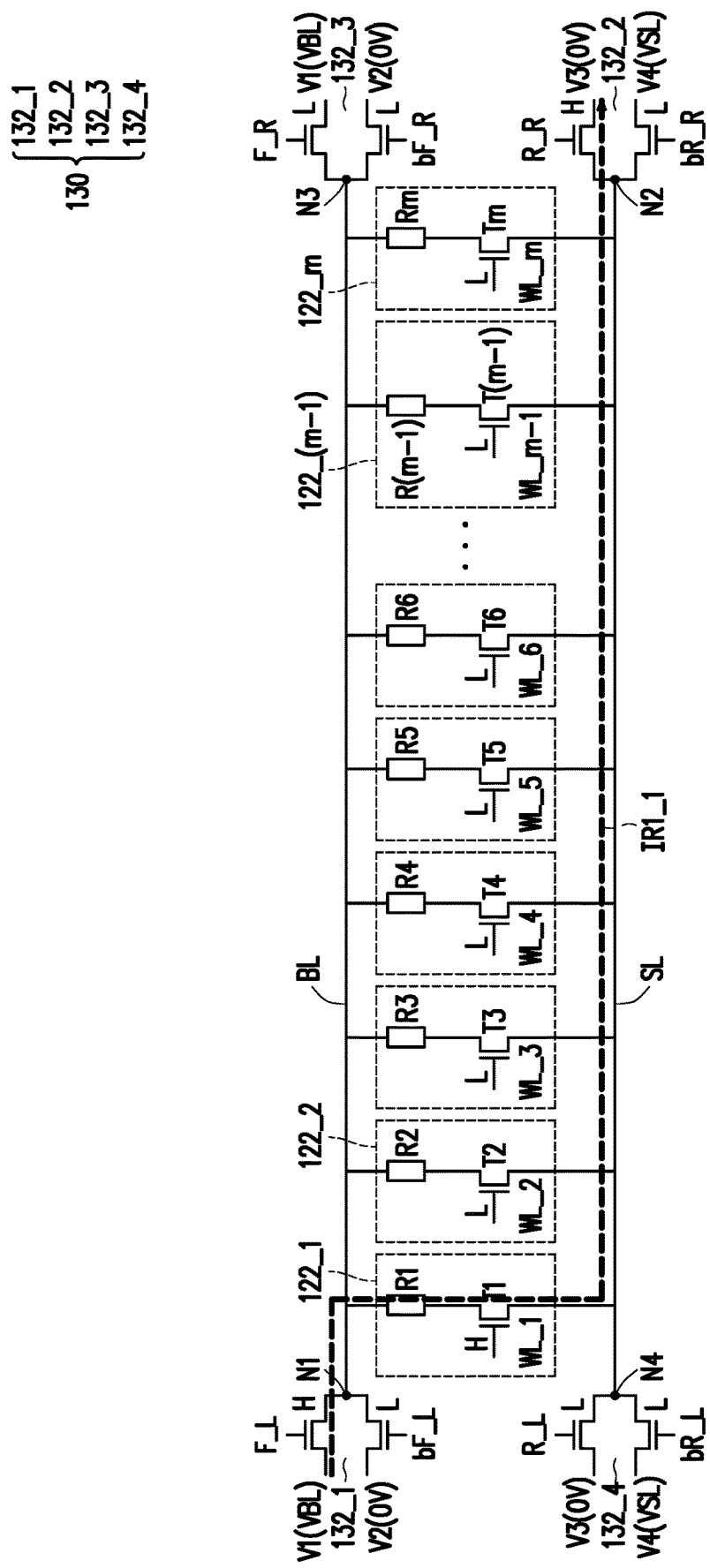
FIG. 3A, FIG. 3B, FIG. 3C and FIG. 3D illustrate schematic diagrams of a voltage applying operation performed on the memory cells by the voltage selector circuit in the embodiment of FIG. 2.
Figure 3B:
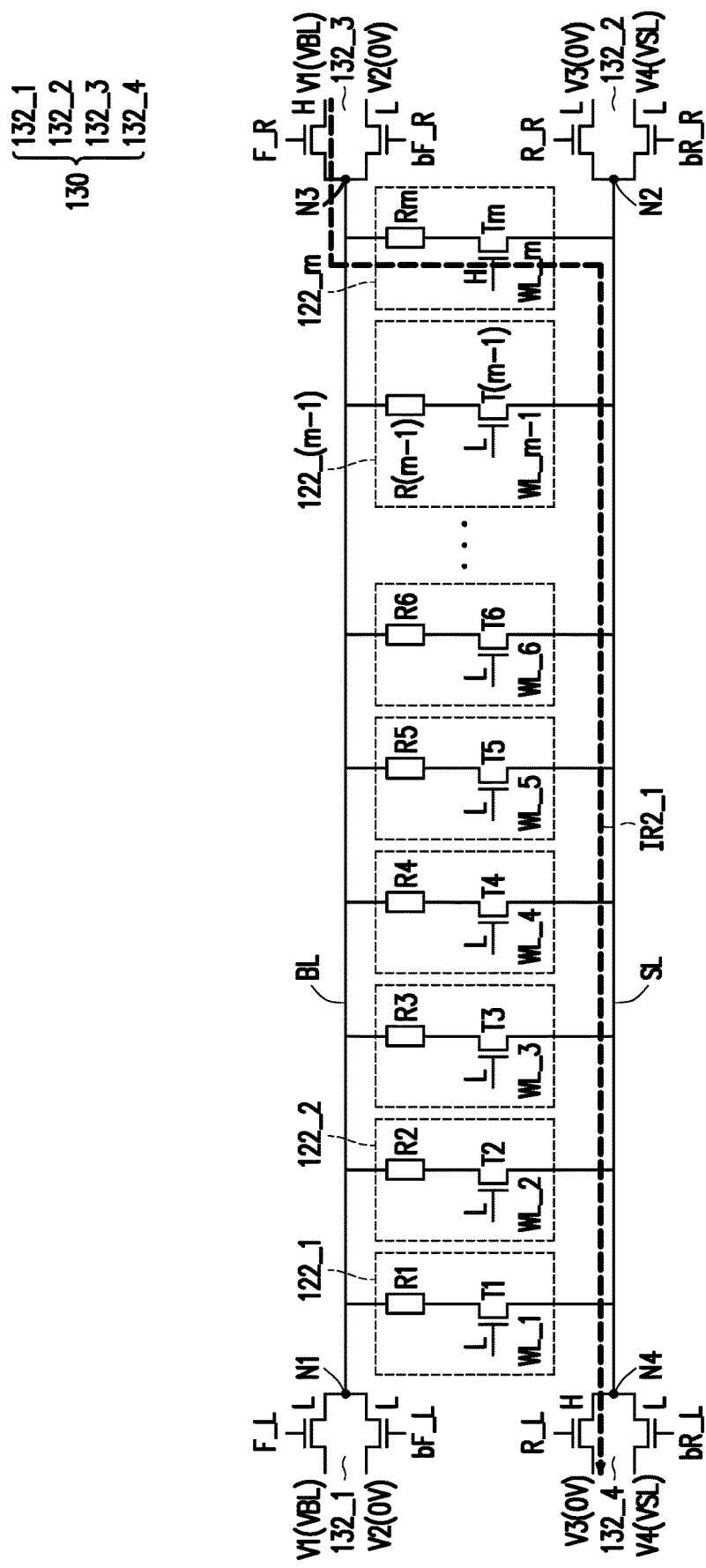
Figure 3C:
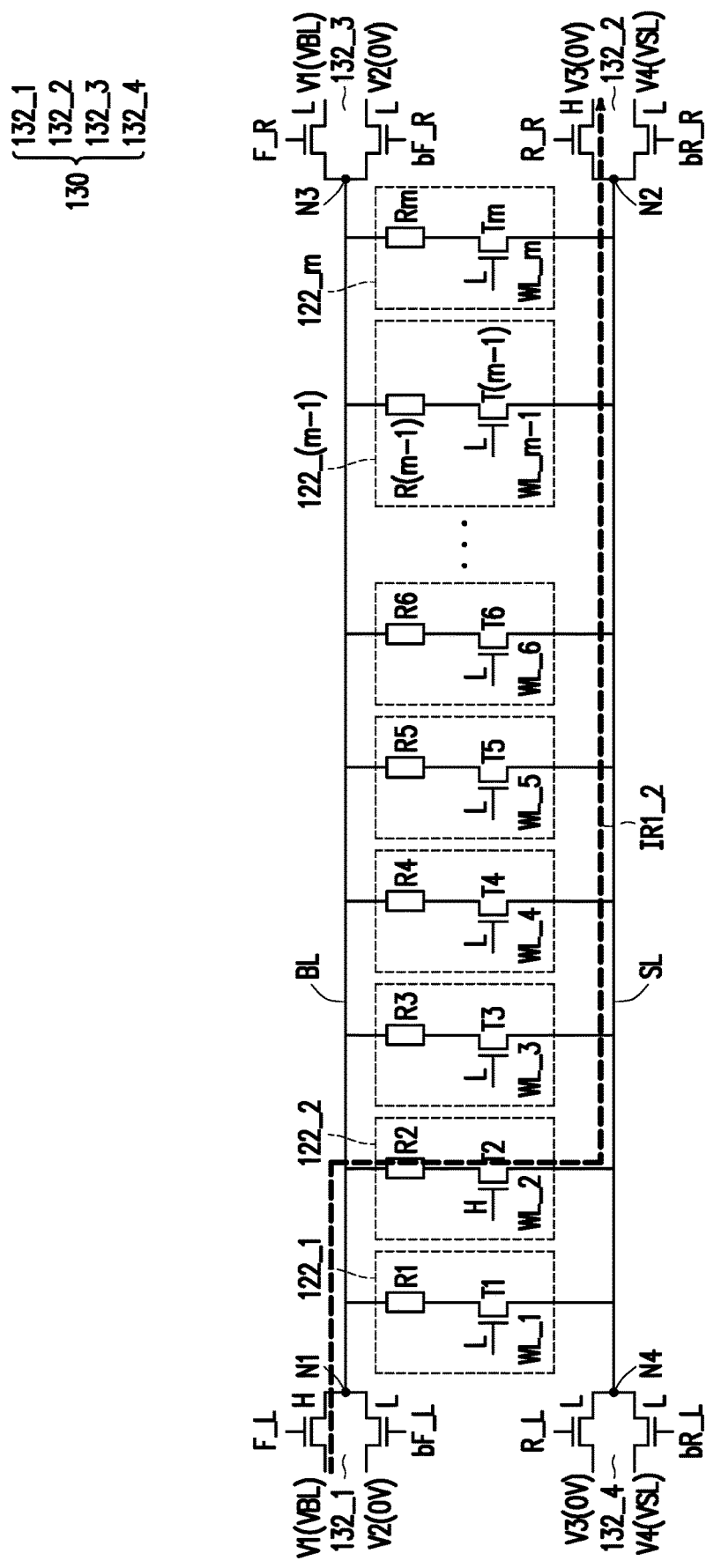
Figure 3D:
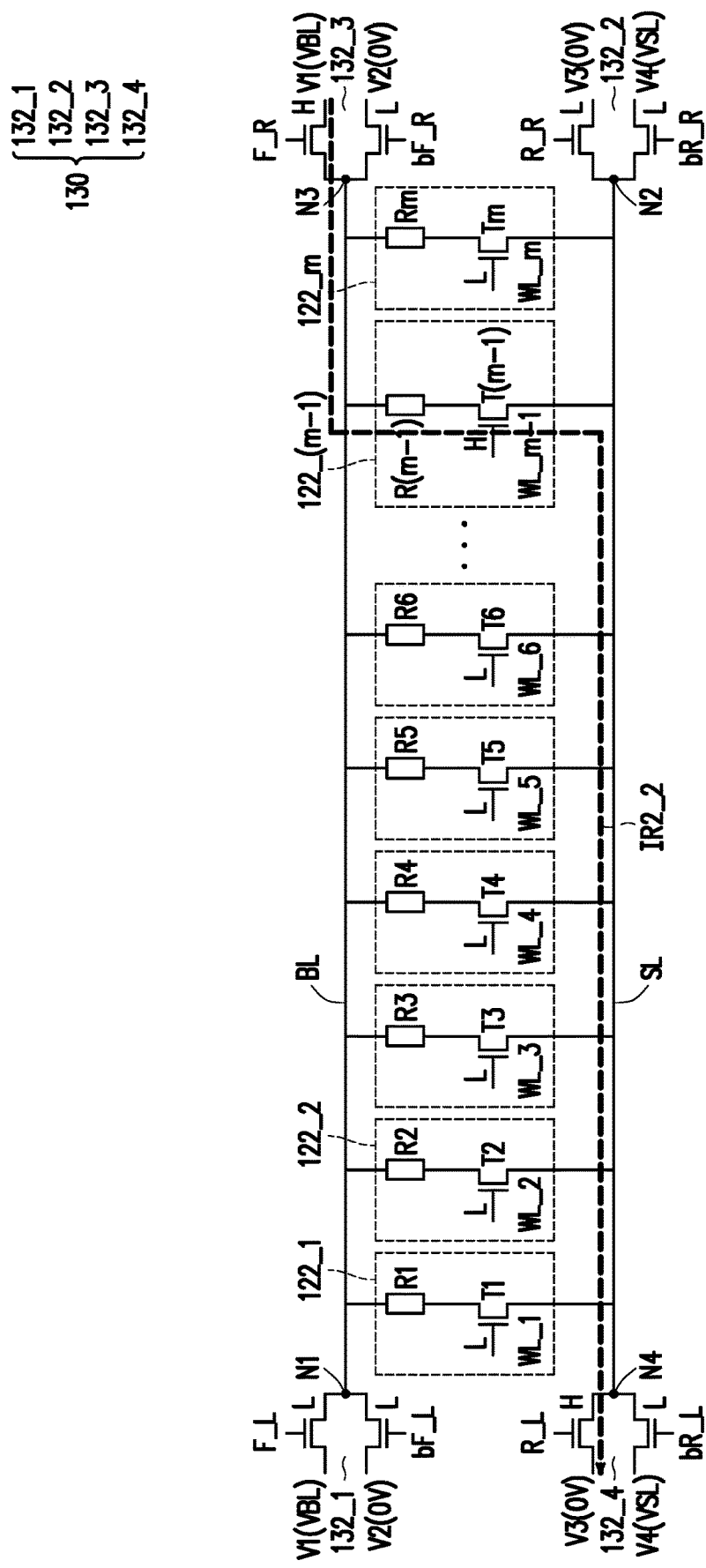
Figure 4:
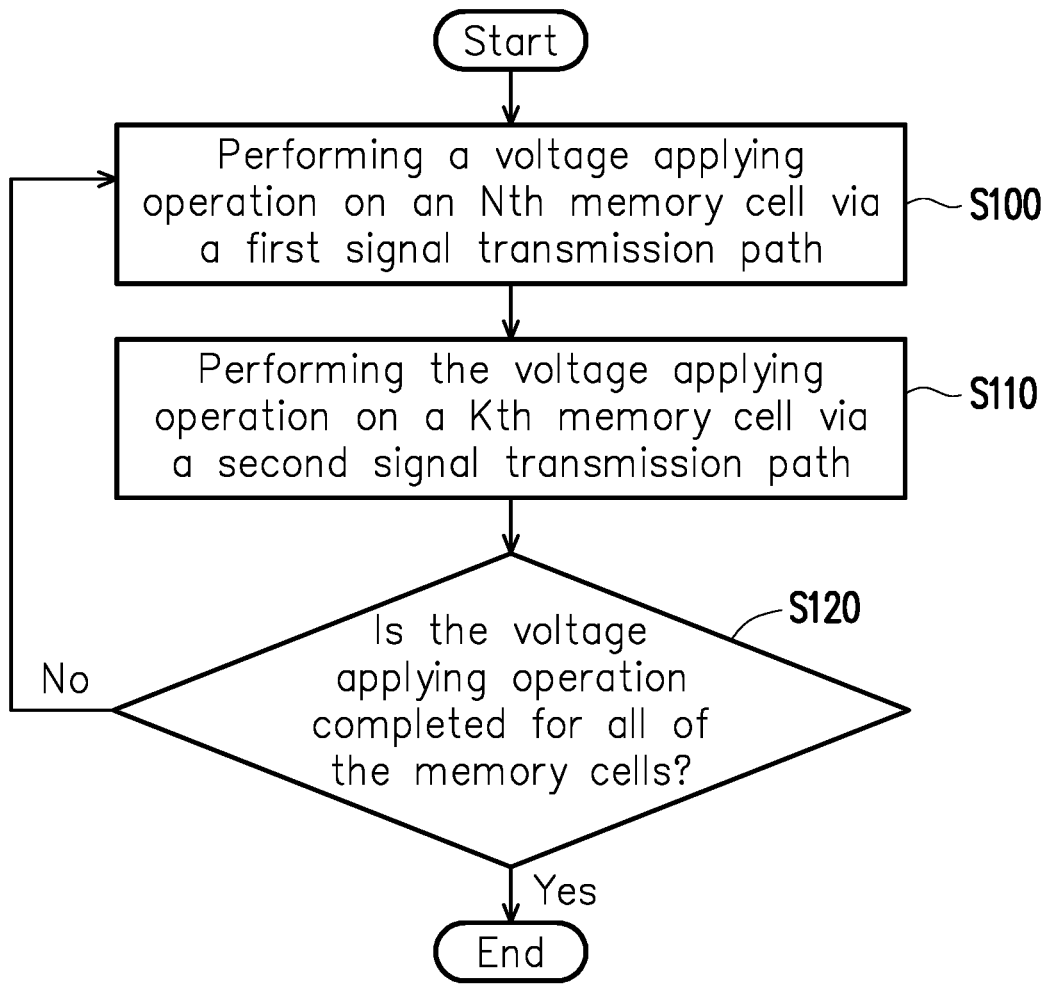
FIG. 4 illustrates a flowchart of an operating method of a resistive memory apparatus in an embodiment of the invention.

Specifically, with reference to FIG. 3A to FIG. 4, in step S100, the voltage selector circuit 130 performs the voltage applying operation on an Nth memory cell via a first signal transmission path IR1_1, as shown in FIG. 3A, where N is a positive integer less than M (N<M). In FIG. 3A, the voltage selector circuit 130 performs the voltage applying operation on the first memory cell 122_1, i.e., N=1. In step S110, the voltage selector circuit 130 performs the voltage applying operation on a Kth memory cell via a second signal transmission path IR2_1, as shown in FIG. 3B, where K is a positive integer less than or equal M (K≤M). In FIG. 3B, the voltage selector circuit 130 performs the voltage applying operation on the Mth memory cell 122_m, i.e., K=M. For instance, in an embodiment, it is assumed that the memory cell array 120 includes, for example, 1024 memory cells, i.e., M=1024. In step S110, the voltage selector circuit 130 performs the voltage applying operation on the 1024th memory cell. Therefore, M, N and K satisfy a relational expression of N+K=M+1 in steps S100 and S110.

In the present embodiment, the first signal transmission path IR1_1 and the second signal transmission path IR2_1 have substantially identical IR drops and different signal transmission directions. For instance, the first signal transmission path IR1_1 is located between the first terminal N1 and the second terminal N2, and when the switch element T1 is turned on, a current signal is transmitted from the first terminal N1 passing through the variable resistance element R1 and the switch element T1 to the second terminal N2. At this time, the first terminal of the switch element T1 is coupled to the first voltage V1 via the variable resistance element R1, and the second terminal is coupled to the third voltage V3. The second signal transmission path IR2_1 is located between the third terminal N3 and the fourth terminal N4, and when the switch element Tm is turned on, a current signal is transmitted from the third terminal N3 passing through the variable resistance element Rm and the switch element Tm to the fourth terminal N4. At this time, the first terminal of the switch element Tm is coupled to the first voltage V1 via the variable resistance element Rm, and the second terminal is coupled to the third voltage V3. Accordingly, in the present embodiment, the IR drop of the first signal transmission path IR1_1 is substantially identical to the IR drop of the second signal transmission path IR2_1, and the signal transmission direction of the first signal transmission path IR1_1 is different from the signal transmission direction of the second signal transmission path IR2_1.

Subsequently, in step S120, if there are still other memory cells on which the voltage applying operation is still not yet performed, the voltage applying operation 130 performs step S110 again to perform the voltage applying operation on the second memory cell 122_2 via a first signal transmission path IR1_2, i.e., N=2, as shown in FIG. 3C. Afterwards, in step S110, the voltage selector circuit 130 performs the voltage applying operation on the (M−1)th memory cell 122_(m−1) via a second signal transmission path IR2_2, i.e., K=M−1, as shown in FIG. 3D. For instance, in an embodiment, it is assumed that the memory cell array 120 includes, for example, 1024 memory cells, i.e., M=1024. In step S110 performed this time, the voltage selector circuit 130 performs the voltage applying operation on the 1023rd memory cell. M, N and K also satisfy the relational expression of N+K=M+1 in steps S100 and S110 performed this time. Accordingly, in the present embodiment, an IR drop of the first signal transmission path IR1_2 is substantially identical to an IR drop of the second signal transmission path IR2_2, and a signal transmission direction of the first signal transmission path IR1_2 is different from a signal transmission direction of the second signal transmission path IR2_2. The voltage applying operation performed on the remaining memory cells by the voltage selector circuit 130 may be derived from the content disclosed above.

In step S120, if the voltage applying operation is completed for all of the memory cells, the operating method ends. That is to say, the voltage selector circuit 130 repeatedly performs steps S100 and S110 until the voltage applying operation is completed for all of the M memory cells. In an embodiment, step S120 may be performed by, for example, the memory controller 110 so whether or not the voltage selector circuit 130 repeatedly performs the steps S100 and S110 to complete the voltage applying operation can be controlled by the memory controller 110.

In the present embodiment, the first signal transmission path refers to, for example, a signal transmission path between the first terminal N1 and the second terminal N2 with a signal thereon (e.g., the current signal) transmitted from the first terminal N1 to the second terminal N2. The second signal transmission path refers to, for example, a signal transmission path between the third terminal N3 and the fourth terminal N4 with a signal thereon (e.g., the current signal) transmitted from the third terminal N3 to the fourth terminal N4.

Further, in the present embodiment, when the voltage selector circuit 130 performs the voltage applying operation on the memory cells 122_1 to 122_m, the switch element of one of the memory cells is turned on, and the switch elements of the remaining memory cells are not turned on. For instance, when the switch element T1 of the memory cell 122_1 is turned on, the switch elements of the remaining memory cells 122_2 to 122_m are not turned on. When the switch element Tm of the memory cell 122_m is turned on, the switch elements of the remaining memory cells 122_1 to 122_(m−1) are not turned on. On-states of the switch elements T1 to Tm may be controlled by a word line decoder, and enough teaching, suggestion, and implementation illustration regarding a control method of the above may be obtained with reference to common knowledge in the related art. In FIG. 3A to FIG. 3D, a mark H indicates that the control signal of the switch element is at high level such that the switch element is turned on, and a mark L indicates that the control signal of the switch element is at low level such that the switch element is not turned on.

To sum up, in the embodiments of FIG. 3A and FIG. 4, each two of the signal transmission paths are paired up into a group of the signal transmission paths, and each group of the signal transmission paths has substantially identical IR drops and different signal transmission directions. For example, the first signal transmission path IR1_1 and the second signal transmission path IR2_1 are paired into one group, and both signal transmission paths have the substantially identical IR drops and the different signal transmission directions. As another example, the first signal transmission path IR1_2 and the second signal transmission path IR2_2 are paired into one group, and both signal transmission paths have the substantially identical IR drops and the different signal transmission directions. Descriptions for the rest of the signal transmission paths may be deduced by analogy. By sequentially performing the voltage applying operation on the memory cells on basis of two of signal transmission paths having the substantially identical IR drops paired up as one group, the phenomenon of uneven voltage supply on the memory cells caused by the IR drops may be mitigated so as to improve reliability of the memory cells during reading and write operation.

In addition, in the exemplary embodiments of the invention, the voltage applying operation includes, for example, the procedures or operations such as the forming procedure, the initial reset operation, the reset operation, the write operation or the read operation. For instance, in an embodiment, the voltage applying operation is, for example, the forming procedure. In the forming procedure, the first voltage V1 (the bit line voltage VBL) may be set to 4 V, and the fourth voltage V4 (the source line voltage VSL) may be set to 0 V. In an embodiment, the voltage applying operation is, for example, the initial reset operation. In the initial reset operation, the first voltage V1 (the bit line voltage VBL) may be set to 0 V, and the fourth voltage V4 (the source line voltage VSL) may be set to +2 to +3.5 V. In an embodiment, the voltage applying operation is, for example, the reset operation. In the reset operation, the first voltage V1 (the bit line voltage VBL) may be set to 0 V, and the fourth voltage V4 (the source line voltage VSL) may be set to +2 to +3.5 V. In an embodiment, the voltage applying operation is, for example, the set operation. In the set operation, the first voltage V1 (the bit line voltage VBL) may be set to +1.5 to +3.5 V, and the fourth voltage V4 (the source line voltage VSL) may be set to 0 V. Nonetheless, the voltage values of each voltage in the procedures or operations described above are merely illustrative description rather than limitations to the invention.

In the exemplary embodiments of the invention, the voltage applying operation may also be automatically performed. For instance, in an embodiment, the voltage selector circuit 130 can automatically perform the voltage applying operation on the memory cells 122_1 to 122_m according to an input command. For example, clients or manufacturers (before shipping) may give an automatically executed command so the voltage selector circuit 130 can automatically perform the forming procedure and/or the initial reset operation in order to reduce the test cost. In an embodiment, the voltage selector circuit 130 can automatically perform the voltage applying operation on the memory cells 122_1 to 122_m after a power up procedure. For example, clients or manufacturers (before shipping) may set the voltage selector circuit 130 to automatically perform the forming procedure and/or the initial reset operation after the power up procedure is performed for the first time in order to reduce the test cost.

Figure 5:
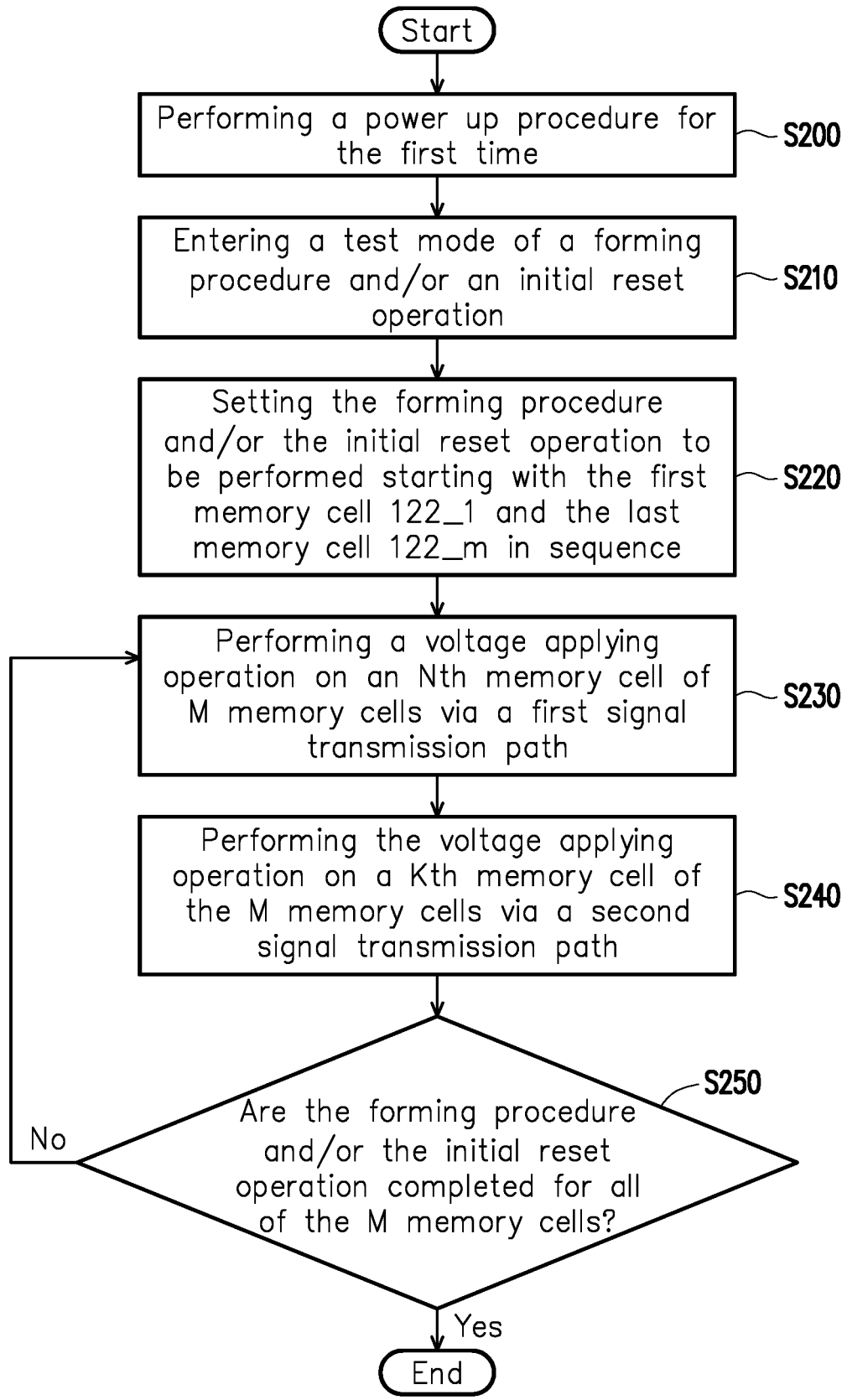
FIG. 5 illustrates a flowchart of an operating method of a resistive memory apparatus in another embodiment of the invention.

FIG. 5 illustrates a flowchart of an operating method of a resistive memory apparatus in another embodiment of the invention. With reference to FIG. 5, the operating method of the resistive memory apparatus is to, for example, perform the forming procedure and/or the initial reset operation on the memory cells 122_1 to 122_m. In step S200, a power up procedure is performed on the resistive memory apparatus 100 for the first time. In step S210, the resistive memory apparatus 100 enters a test mode of a forming procedure and/or an initial reset operation. In step S220, the memory controller 110 sets the forming procedure and/or the initial reset operation to be performed starting with the memory cells 122_1 and 122_m in sequence. In step S230, the voltage selector circuit 130 performs a voltage applying operation on an Nth memory cell of M memory cells via a first signal transmission path. Subsequently, in step S240, the voltage selector circuit 130 performs the voltage applying operation on a Kth memory cell of the M memory cells via a second signal transmission path. In the present embodiment, with respect to the Nth memory cell and the Kth memory cell, an IR drop of the first signal transmission path is substantially identical to an IR drop of the second signal transmission path, and a signal transmission direction of the first signal transmission path is different from a signal transmission direction of the second signal transmission path.

In the present embodiment, step S230 to step S250 are repeated performed in the operating method of the resistive memory apparatus until the forming procedure and/or the initial reset operation are completed for all of the M memory cells, as shown by a loop of step S230 to S250. In an embodiment, with respect to the 1024 memory cells, for example, the loop of step S230 to S250 is performed 512 times in the operating method.

In the present embodiment, when the voltage selector circuit 130 performs the forming procedure on the memory cells, the first voltage V1 (the bit line voltage VBL) may be set to 4 V and the fourth voltage V4 (the source line voltage VSL) may be set to 0 V in the forming procedure. In the present embodiment, when the voltage selector circuit 130 performs the initial reset operation on the memory cells, the first voltage V1 (the bit line voltage VBL) may be set to 0 V and the fourth voltage V4 (the source line voltage VSL) may be set to +2 to +3.5 V in the initial reset operation. In the present embodiment, when the voltage selector circuit 130 performs both the forming procedure and the initial reset operation on the memory cells, the voltage selector circuit 130 can perform the forming procedure on a target memory cell first before performing the initial reset operation. Taking the memory cells 122_1 and 122_m for example, the voltage selector circuit 130 first performs the forming procedure on the memory cell 122_1 before performing the initial reset operation. Next, the voltage selector circuit 130 then performs the forming procedure and the initial reset operation on the memory cell 122_m in sequence.

In addition, sufficient teaching, suggestion, and implementation illustration regarding the operating method of the resistive memory apparatus in the embodiments of the invention may be obtained from the above embodiments depicted in FIG. 1 to FIG. 4, and thus related description thereof is not repeated hereinafter.

In summary, in the exemplary embodiments of the invention, the voltage applying operation includes the procedures or operations such as the forming procedure, the initial reset operation, the reset operation, the write operation or the read operation. By sequentially performing the voltage applying operation on the memory cells on basis of two of signal transmission paths having the substantially identical IR drops paired up as one group, the phenomenon of uneven voltage supply on the memory cells caused by the IR drops may be mitigated so as to improve reliability of the memory cells during reading and write operation. Moreover, clients or manufacturers (before shipping) may set the voltage selector circuit to automatically perform the forming procedure and/or the initial reset operation in order to reduce the test cost by giving the automatically executed command or after performing the power up procedure for the first time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A resistive memory apparatus, comprising:
   a memory cell array, comprising a plurality of memory cells; and
   a voltage selector circuit, coupled to the memory cell array, and performing a voltage applying operation on the memory cells via a plurality of different signal transmission paths, each of the signal transmission paths passing one of the memory cells,
   wherein IR drops of two of the signal transmission paths are substantially identical, and signal transmission directions of said two signal transmission paths are different,
   wherein each two of the signal transmission paths are paired up into a group of the signal transmission paths, and each group of the signal transmission paths has substantially identical IR drops and different signal transmission directions.

2. The resistive memory apparatus of claim 1, wherein the memory cell array comprises a first terminal, a second terminal, a third terminal and a fourth terminal, each group of the signal transmission paths comprises a first signal transmission path and a second signal transmission path, the first signal transmission path is located between the first terminal and the second terminal with a signal thereon transmitted from the first terminal to the second terminal, and the second signal transmission path is located between the third terminal and the fourth terminal with a signal thereon transmitted from the third terminal to the fourth terminal.

3. The resistive memory apparatus of claim 2, wherein the voltage selector circuit comprises:
   a first voltage selector, coupled to the first terminal of the memory cell array, and configured to select whether to couple the first terminal to a first voltage or a second voltage; and
   a second voltage selector, coupled to the second terminal of the memory cell array, and configured to select whether to couple the second terminal to a third voltage or a fourth voltage.

4. The resistive memory apparatus of claim 3, wherein the voltage selector circuit further comprises:
   a third voltage selector, coupled to the third terminal of the memory cell array, and configured to select whether to couple the third terminal to the first voltage or the second voltage; and
   a fourth voltage selector, coupled to the fourth terminal of the memory cell array, and configured to select whether to couple the fourth terminal to the third voltage or the fourth voltage.

5. The resistive memory apparatus of claim 2, wherein each of the memory cells comprises a switch element, the switch element comprising a first terminal, a second terminal and a control terminal, the first terminal of the switch element is coupled to the first terminal and the third terminal of the memory cell array via a bit line, the second terminal of the switch element is coupled to the second terminal and the fourth terminal of the memory cell array via a source line, and the control terminal of the switch element is coupled to a word line.

6. The resistive memory apparatus of claim 5, wherein when the voltage selector circuit performs the voltage applying operation on one of the memory cells, the switch element of the one of the memory cells is turned on, and the switch elements of the remaining memory cells are not turned on.

7. The resistive memory apparatus of claim 1, wherein the voltage selector circuit performs the voltage applying operation on the memory cells according to an input command.

8. The resistive memory apparatus of claim 1, wherein the voltage selector circuit performs the voltage applying operation on the memory cells after a power up procedure.

9. The resistive memory apparatus of claim 1, wherein the voltage applying operation comprises one of a forming procedure, an initial reset operation, a reset operation, a set operation, a write operation and a read operation, or a combination thereof.

10. An operating method of a resistive memory apparatus, wherein the resistive memory apparatus comprises M memory cells, and the operating method comprises:
   a first step for performing a voltage applying operation on an Nth memory cell of the M memory cells via a first signal transmission path, wherein the first signal transmission path passes the Nth memory cell, and N<M where M and N are positive integers;
   a second step for performing the voltage applying operation on a Kth memory cell of the M memory cells via a second signal transmission path, wherein the second signal transmission path passes the Kth memory cell, and K≤M where K is a positive integer, wherein the first signal transmission path and the second signal transmission path are paired up into a group of the signal transmission paths; and
   a third step for repeatedly performing the first step and the second step until the voltage applying operation is completed for all of the M memory cells,
   wherein M, N and K satisfy a relational expression of N+K=M+1, an IR drop of the first signal transmission path is substantially identical to an IR drop of the second signal transmission path, and a signal transmission direction of the first signal transmission path is different from a signal transmission direction of the second signal transmission path, and each group of the signal transmission paths has substantially identical IR drops and different signal transmission directions.

11. The operating method for the resistive memory apparatus of claim 10, wherein the voltage applying operation is performed according to an input command.

12. The operating method for the resistive memory apparatus of claim 10, wherein the voltage applying operation is performed after a power up procedure.

13. The operating method for the resistive memory apparatus of claim 10, wherein the voltage applying operation comprises one of a forming procedure, an initial reset operation, a reset operation, a set operation, a write operation and a read operation, or a combination thereof.

* * * * *